United States Patent
English

(10) Patent No.: US 7,262,369 B1
(45) Date of Patent: Aug. 28, 2007

(54) COMBINED BOARD LEVEL EMI SHIELDING AND THERMAL MANAGEMENT

(75) Inventor: Gerald Robert English, Glen Ellyn, IL (US)

(73) Assignee: Laird Technologies, Inc., St. Louis, MO (US)

( * ) Notice: Subject to any disclaimer, the term of this patent is extended or adjusted under 35 U.S.C. 154(b) by 0 days.

(21) Appl. No.: 11/431,847

(22) Filed: May 10, 2006

Related U.S. Application Data

(60) Provisional application No. 60/780,796, filed on Mar. 9, 2006.

(51) Int. Cl.
*H01R 4/00* (2006.01)
*H05K 9/00* (2006.01)

(52) U.S. Cl. .................. 174/370; 174/377; 174/387

(58) Field of Classification Search .............. 174/377, 174/382, 370, 387
See application file for complete search history.

(56) References Cited

U.S. PATENT DOCUMENTS

| | | | |
|---|---|---|---|
| 3,047,648 A | 7/1962 | Mowatt | |
| 3,208,511 A | 9/1965 | McAdam | |
| 3,572,428 A | 3/1971 | Monaco | |
| 3,721,746 A | 3/1973 | Krappenberger | |
| 4,203,488 A | 5/1980 | Johnson et al. | |
| 4,235,285 A | 11/1980 | Johnson et al. | |
| 4,345,267 A | 8/1982 | Corman et al. | |
| 4,405,961 A | 9/1983 | Chow et al. | |
| 4,433,886 A | 2/1984 | Cassarly et al. | |
| 4,481,525 A | 11/1984 | Calabro et al. | |
| 4,508,163 A | 4/1985 | McCarthy | |
| 4,661,888 A | 4/1987 | Jewell et al. | |
| 4,679,118 A | 7/1987 | Johnson et al. | |
| 4,729,426 A | 3/1988 | Hinshaw | |
| 4,754,101 A | 6/1988 | Stickney et al. | |
| 4,933,746 A | 6/1990 | King | |
| 5,052,481 A | 10/1991 | Horvath et al. | |
| 5,060,114 A | 10/1991 | Feinberg et al. | |
| 5,130,888 A | 7/1992 | Moore | |
| 5,175,395 A | 12/1992 | Moore | |
| 5,175,613 A | 12/1992 | Barker, III et al. | |
| 5,208,731 A | 5/1993 | Blomquist | |
| 5,241,453 A | 8/1993 | Bright et al. | |
| 5,285,350 A | 2/1994 | Villaume | |

(Continued)

FOREIGN PATENT DOCUMENTS

EP 0632686 8/1996

(Continued)

*Primary Examiner*—Hung V. Ngo
(74) *Attorney, Agent, or Firm*—Harness, Dickey & Pierce, P.L.C.

(57) ABSTRACT

According to various aspects of the present disclosure, exemplary embodiments are provided of EMI shielding apparatus capable of providing board level EMI shielding for one or more electronic components while also providing dissipation of heat generated by the one or more electronic components. In one particular embodiment, an apparatus generally includes a board level shield having at least one resiliently compressible EMI gasket disposed along at least a portion of the board level shield. At least one thermally-conductive compliant material is disposed relative to an inner surface of the board level shield and to the one or more electrical components. The at least one thermally-conductive material can form a thermally-conducting heat path from the one or more electrical components to the board level shield.

4 Claims, 3 Drawing Sheets

U.S. PATENT DOCUMENTS

| | | | |
|---|---|---|---|
| 5,287,001 A | 2/1994 | Buchmann et al. | |
| 5,288,313 A | 2/1994 | Portner | |
| 5,295,043 A | 3/1994 | Beijer | |
| 5,329,426 A | 7/1994 | Villani | |
| 5,354,951 A | 10/1994 | Lange, Sr. et al. | |
| 5,357,404 A | 10/1994 | Bright et al. | |
| 5,365,399 A | 11/1994 | Kent et al. | |
| 5,367,433 A | 11/1994 | Blomquist | |
| 5,416,668 A | 5/1995 | Benzoni | |
| 5,485,037 A | 1/1996 | Marrs | |
| 5,524,908 A * | 6/1996 | Reis | 277/654 |
| 5,541,811 A | 7/1996 | Henningsson et al. | |
| 5,550,713 A | 8/1996 | Pressler et al. | |
| 5,552,635 A | 9/1996 | Kim et al. | |
| 5,566,052 A | 10/1996 | Hughes | |
| 5,640,047 A | 6/1997 | Nakashima | |
| 5,663,786 A | 9/1997 | Miyamori | |
| 5,706,579 A | 1/1998 | Ross | |
| 5,717,248 A | 2/1998 | Neumann et al. | |
| 5,717,577 A | 2/1998 | Mendolia et al. | |
| 5,763,824 A | 6/1998 | King et al. | |
| 5,804,875 A | 9/1998 | Remsburg et al. | |
| 5,811,050 A | 9/1998 | Gabower | |
| 5,866,943 A | 2/1999 | Mertol | |
| 5,893,409 A | 4/1999 | Kohler et al. | |
| 5,917,701 A | 6/1999 | Solberg | |
| 5,990,418 A | 11/1999 | Bivona et al. | |
| 6,005,186 A | 12/1999 | Bachman | |
| 6,025,991 A | 2/2000 | Saito | |
| 6,049,469 A | 4/2000 | Hood, III et al. | |
| 6,075,700 A | 6/2000 | Houghton et al. | |
| 6,122,167 A | 9/2000 | Smith et al. | |
| 6,166,918 A | 12/2000 | Olofsson et al. | |
| 6,178,097 B1 | 1/2001 | Hauk, Jr. | |
| 6,178,318 B1 | 1/2001 | Holmberg et al. | |
| 6,181,573 B1 | 1/2001 | Riet | |
| 6,195,267 B1 | 2/2001 | MacDonald, Jr. et al. | |
| 6,205,026 B1 | 3/2001 | Wong et al. | |
| 6,208,515 B1 | 3/2001 | Klein | |
| 6,212,073 B1 | 4/2001 | Yamaguchi | |
| 6,269,008 B1 | 7/2001 | Hsu | |
| 6,347,035 B1 | 2/2002 | Hamano et al. | |
| 6,348,654 B1 * | 2/2002 | Zhang et al. | 174/362 |
| 6,377,472 B1 | 4/2002 | Fan | |
| 6,377,475 B1 | 4/2002 | Reis | |
| 6,388,189 B1 | 5/2002 | Onoue | |
| 6,410,846 B1 | 6/2002 | Benn, Jr. | |
| 6,430,043 B1 | 8/2002 | Osburn | |
| 6,445,583 B1 | 9/2002 | Kline et al. | |
| 6,490,173 B2 | 12/2002 | Perkins et al. | |
| 6,501,018 B2 | 12/2002 | Mayer | |
| 6,504,095 B1 | 1/2003 | Hoffstrom | |
| 6,552,261 B2 | 4/2003 | Shlahtichman et al. | |
| 6,590,783 B2 | 7/2003 | Spratte et al. | |
| 6,624,432 B1 | 9/2003 | Gabower et al. | |
| 6,673,998 B1 | 1/2004 | Wu | |
| 6,674,653 B1 | 1/2004 | Valentine | |
| 6,676,137 B2 | 1/2004 | Dean | |
| 6,744,640 B2 * | 6/2004 | Reis et al. | 361/818 |
| 6,943,287 B2 | 9/2005 | Lloyd et al. | |
| 6,946,598 B1 | 9/2005 | Konshak | |
| 6,979,773 B2 | 12/2005 | Fursich | |
| 6,989,994 B2 | 1/2006 | Maguire et al. | |
| 7,013,558 B2 | 3/2006 | Bachman | |
| 2001/0046119 A1 | 11/2001 | Hamano et al. | |
| 2004/0052064 A1 | 3/2004 | Oliver et al. | |
| 2005/0236171 A1 | 10/2005 | Garcia | |
| 2005/0237727 A1 | 10/2005 | Baker | |

FOREIGN PATENT DOCUMENTS

| | | |
|---|---|---|
| EP | 0910005 | 4/1999 |
| EP | 1364565 | 6/2002 |
| EP | 1493314 | 10/2006 |
| WO | WO 01/41521 | 6/2001 |
| WO | WO 02/069687 | 9/2002 |
| WO | WO 03/088729 | 10/2003 |

* cited by examiner

COMBINED BOARD LEVEL EMI SHIELDING AND THERMAL MANAGEMENT

CROSS-REFERENCE TO RELATED APPLICATION

This application claims the benefit of U.S. Provisional Application No. 60/780,796 filed Mar. 9, 2006, the disclosure of which is incorporated herein by reference.

FIELD

The present disclosure generally relates (but not exclusively) to apparatus and methods capable of providing board level EMI shielding for board-mounted electrical components, and dissipation of heat generated by the electrical components.

BACKGROUND

The statements in this section merely provide background information related to the present disclosure and may not constitute prior art.

Electronic equipment include electrical components and circuits mounted on a substrate that can be sensitive to electromagnetic interference (EMI) and radio frequency interference (RFI). Such EMI/RFI interference may originate from internal sources within the electronic equipment or from external EMI/RFI interference sources. Interference can cause degradation or complete loss of important signals, rendering the electronic equipment inefficient or inoperable. Accordingly, the radio frequency (RF) circuits (sometimes referred to as RF modules or transceiver circuits) usually require EMI/RFI shielding in order to function properly. The shielding reduces interference not only from external sources, but also from various functional blocks within the module.

As you used herein, the term "EMI" should be considered to generally include and refer to both EMI and radio frequency interference (RFI) emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

By way of example, electronic circuits or components of a printed circuit board (PCB) are often enclosed with shields to localize EMI/RFI within its source, and to insulate other devices proximal to the EMI/RFI source. Such shields may be soldered or otherwise affixed to the PCB, thus increasing the overall size of the PCB. However, many electronic components generate significant amounts of heat. Excessive heat build up can lead to reduced product life and reliability. Thus, various constructions have been proposed for removing heat generated by electronic components.

SUMMARY

According to various aspects of the present disclosure, exemplary embodiments are provided of assemblies capable of providing board level EMI shielding for one or more electrical components of a board, while also providing dissipation of heat generated by the one or more electrical components. Other aspects relate to components of board level EMI shielding and thermal management assemblies. Further aspects relate to methods of using combined board level EMI shielding and thermal management assemblies. Additional aspects relate to methods of making combined board level EMI shielding and thermal management assemblies, and methods of making components thereof.

In one exemplary embodiment, an apparatus generally includes a board level shield having at least one resiliently compressible EMI gasket disposed along at least a portion of the board level shield. At least one thermally-conductive compliant material is disposed for forming a thermally-conducting heat path from the one or more electrical components to the board level shield.

In another exemplary embodiment, an apparatus generally includes a single-piece board level shielding can having a plurality of interior EMI shielding compartments. At least one thermally-conductive compliant material is disposed for forming a thermally-conducting heat path from the one or more electrical components to the single-piece board level shielding can.

Other exemplary embodiments include methods for providing board level EMI shielding and dissipating heat from one or more electrical components of a board. In one such embodiment, a method generally includes positioning a board level shielding can relative to the one or more electrical components such that the one or more electrical components are disposed within at least one interior EMI shielding compartment cooperatively defined by the board level shielding can and at least one resiliently compressible EMI gasket disposed along at least a portion of the board level shielding can. This positioning can also include contacting at least one thermally-conductive complaint material with the one or more electrical components and an inner surface of the board level shielding can such that a thermally-conducting heat path is formed between the one or more electrical components and the board level shielding can.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
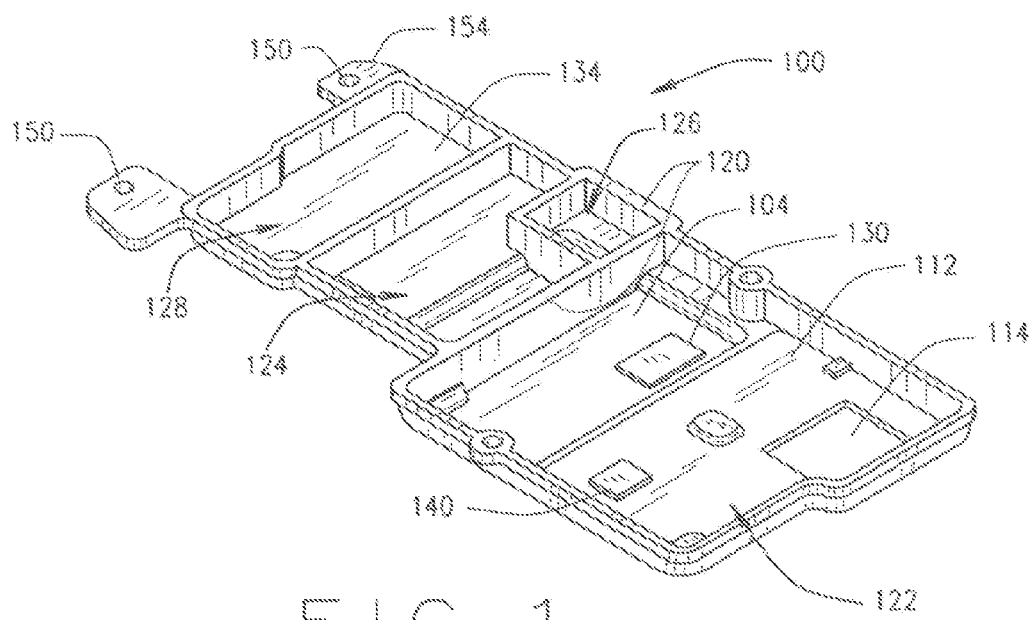
FIG. 1 is a perspective view of one exemplary embodiment of an EMI shielding apparatus.

The following description is merely exemplary in nature and is not intended to limit the present disclosure, application, or uses. It should be understood that throughout the drawings, corresponding reference numerals indicate like or corresponding parts and features.

According to various aspects of the present disclosure, there are provided various exemplary embodiments of assemblies capable of providing board level EMI shielding for one or more electrical components of a board, while also providing dissipation of heat generated by the one or more electrical components. Other aspects relate to components of board level EMI shielding and thermal management assemblies. Further aspects relate to methods of using combined board level EMI shielding and thermal management assemblies. Additional aspects relate to methods of making combined board level EMI shielding and thermal management assemblies, and methods of making components thereof.

In one exemplary embodiment, an apparatus generally includes a board level shield having at least one resiliently compressible EMI gasket disposed along at least a portion of the board level shield. At least one thermally-conductive compliant material (e.g., thermally-conductive pads, greases, putties, form-in-place materials, silk screened materials, combinations thereof, etc.) disposed for forming a thermally-conducting heat path from the one or more electrical components to the board level shield.

In another exemplary embodiment, an apparatus generally includes a single-piece board level shielding can having a plurality of interior EMI shielding compartments. At least one thermally-conductive compliant material (e.g., thermally-conductive pads, greases, putties, form-in-place materials, silk screened materials, combinations thereof, etc.) is disposed for forming a thermally-conducting heat path from the one or more electrical components to the single-piece board level shielding can. This thermally-conducting heat path can allow the single-piece board level shielding to operate as a heat sink and/or a heat spreader for the one or more electrical components.

Other exemplary embodiments include methods for providing board level EMI shielding and dissipating heat from one or more electrical components of a board. In one such embodiment, a method generally includes positioning a board level shielding can relative to the one or more electrical components such that the one or more electrical components are disposed within at least one interior EMI shielding compartment cooperatively defined by the board level shielding can and at least one resiliently compressible EMI gasket disposed along at least a portion of the board level shielding can. This positioning can also include contacting at least one thermally-conductive compliant material (e.g., thermally-conductive pads, greases, putties, form-in-place materials, silk screened materials, combinations thereof, etc.) with the one or more electrical components and an inner surface of the board level shielding can such that a thermally-conducting heat path is formed between the one or more electrical components and the board level shielding can.

Various embodiments include at least one thermal interface material (TIM) (e.g., thermally-conductive compliant material, thermally-conductive pads, greases, putties, form-in-place materials, silk screened materials, combinations thereof, etc.). The thermal interface material is adapted to contact one or more electrical components when the EMI shielding apparatus is installed. This contact can facilitate transferring and/or thermally conducting of heat from the one or more electrical components to the board level shield, whereby the board level shield can essentially function as a heat sink and/or a heat spreader for the one or more electrical components. In various embodiments, the thermal interface material may comprise one or more thermally-conductive elastomer ribs, which form or define at least one or more interior EMI shielding compartments. The thermal interface material may also be in the form of one or more greases, putties, or pads of material that are dispensed, affixed, or attached to the board level shield at certain locations that topographically provide for contacting and conducting heat away from at least one electrical component or integrated circuit to the board level shield. In some preferred embodiments, a thermal interface material is compressed against one or the electrical components, to thereby allow for improved heat transfer from the electrical component(s) to a cover as compared to those designs in which air defines the heat path between the electrical component and the underside of the cover. In such embodiments, various thermal interface materials can be used, which are preferably materials having higher thermal conductivities than air alone.

Some embodiments include a cover or board level shield having at least one electrically-conductive member disposed on the inner surface of the cover. When the EMI shielding apparatus is installed, the electrically-conductive member may contact one or more electrical components to establish electrical conductivity (e.g., a ground) from the one or more electrical components to the cover or board level shield of the EMI shielding apparatus.

Some embodiments may include at least one electrically-insulating member disposed on the inner side of a cover or board level shield. This electrically-insulating member can insulate electrical components from electrical conduction to the cover or board level shield.

Accordingly, various exemplary embodiments provide EMI shielding assemblies capable of at least one or more of absorbing EMI energy radiation emitted from enclosed electrical components, shielding the enclosed electrical components from EMI emitted by devices external to the EMI shielding apparatus, providing thermal conduction and/or thermal insulation between one or more electrical components and the EMI shielding apparatus, and/or providing an electrical path (e.g., a ground) between one or more electrical components and the EMI shielding apparatus.

In one particular embodiment, there is provided an apparatus that includes a single piece, multi-compartment thermally-enhanced board level shield. In this example, the board level shield may comprise stamped or drawn metal or metal alloys, or the board level shield may comprise thermally-conductive plastic. The board level shield may include one or more molded electrically-conductive elastomer ribs that form at least one or more EMI shielding compartments. The electrically-conductive elastomer ribs can be configured for electrically grounding the apparatus to a board, such as a printed circuit board, etc. At least one of the compartments can include thermal interface material configured (e.g., shaped, sized, material, etc.) to provide a thermally-conductive heat path between the shield can or cover and the electrical element/component(s) enclosed therein. Other embodiments, however, may not include any such electrically-conductive elastomer ribs. Still further embodiments may include electrically-conductive elastomer ribs dispensed using form-in-place dispensing equipment or using a hand-held dispenser or caulk gun.

Embodiments of the EMI shielding apparatus can be mounted to a board (e.g., printed circuit board, etc.) and/or another mounting structure. This mounting can provide a heat spreading effect and a heat path to another element of the electronic system.

Additionally, other materials (e.g., thermally-conductive pad-like materials with adhesive backings, thermally-conductive materials, electrically-conducting materials, insulating materials, fabric-over-foam gaskets, thermal insulators, combinations thereof, etc.) can be disposed on an inner surface of an EMI shielding apparatus. In some exemplary embodiments, an adhesively attached pad-like material can provide an electrical path between an electrical component and the EMI shielding apparatus. Additionally, or alternatively, an adhesively attached pad-like material can provide thermal insulation, electrical insulation, and/or help absorb unwanted EMI radiation from encased electronic devices.

In some embodiments, pad-like materials with adhesive backing can be used where the adhesive backing can help form a more secure attachment of the pad-like materials to the EMI shielding apparatus. Alternatively, other embodiments can include materials (e.g., thermally-conductive, electrically-conductive, and/or insulating material pads, etc.) dispensed via form-in-place dispensing equipment, hand-held dispenser or caulk gun, silk screening, etc. Some embodiments of an EMI shielding apparatus can include combining electrical and thermal functionality with an environmental sealing member, which can be used, for example, around an electronic display for an electronic device (e.g., cell phone display, Personal Digital Assistant (PDA) display, gaming device display, etc.) for providing a dust and/or liquid seal.

The various EMI shielding apparatus described and/or shown herein can be used in a wide variety of devices and electronic equipment. By way of example only, one or more of the EMI shield assemblies described and/or shown herein may be used in conjunction with cellular telephones and other wireless/RF devices. In such examples, an EMI shielding apparatus can be shipped or delivered with one or more thermal interface materials installed on the board level shield. During assembly of the cellular phone (or other wireless/RF device, as the case may be), the entire EMI shielding apparatus can be screwed into screw bosses of the electronic device housing. The screws can thus provide the mechanical or clamping force on the thermal interface material for low thermal impedance. The screws can also be electrically conductive. In such embodiments, the overall height of the EMI shielding apparatus can depend, for example, on the deflection needs for the electrically-conductive elastomer (or other suitable resilient compressible gasket material, etc.). Some embodiments include an EMI shielding apparatus that can be "dropped-in" and used with existing wireless/RF communication devices.

FIGS. 1 through 4 illustrate an exemplary embodiment of an EMI shielding apparatus 100 embodying one or more aspects of the present disclosure. As shown, the apparatus 100 includes a cover or shielding can 102. The cover 102 includes a first cover portion 104 and at least a second cover portion 112, which is adjacent to the first cover portion 104.

The cover 102 may be integrally or monolithically formed from a single piece of material through a drawing or stamping process. The cover 102 may be formed to have differing recessed heights or depths. In the first embodiment, for example, the first cover portion 104 is drawn such that it is deeper than the second cover portion 112. This difference in depth is illustrated in the elevation view of the first embodiment 100 shown in FIG. 3.

The second cover portion 112 includes at least one opening 114 therein. The opening 114 can be provided to interface with various electronic device display screens and display technologies. By way of example, electronic devices can include cell phones, Personal Digital Assistants (PDAs), Geographic Positioning Service (GPS) receivers, game controllers, iPod-like portable music devices, finger print readers, etc. Exemplary display technologies can include Liquid Crystal Display (LCDs), Organic Light Emitting Diode (OLED), touch-screen and plasma display technologies. Alternatively, the cover or board level shield 102 can have any number of different configurations, such as without any opening 114 and/or with different shapes, sizes, depths, openings in different shapes and/or sizes, etc.

The EMI shielding apparatus 100 may include resiliently compressible material disposed along at least a portion of the cover 102. This resiliently compressible material is electrically-conductive and/or thermally-conductive. In this example embodiment, electrically-conductive elastomer material forms ribs or walls 120. The ribs or walls 120 may be dispensed onto (e.g., via form-in-place dispensing equipment, hand-held dispenser or caulk gun, etc.), molded onto (e.g., overmolded, etc.) or attached (e.g., adhesively attached, etc.) to the various cover portions 104 and 112. By way of example only, elastomer ribs 120 may be dispensed onto the cover 102, or may be over-molded onto the cover 102 through an insert-molding process.

The electrically-conductive elastomer ribs or walls 120 can be formed from various materials. In some preferred embodiments, the ribs or walls 120 are formed from elastomeric materials filled with electrically-conductive particles. Examples of preferred elastomeric materials include silicone, fluorosilicone, fluorocarbon, and Ethylene Propylene Diene Monomer [EPDM]. Thermoplastic elastomer can also be used as the elastomeric material. Examples of preferred electrically-conductive particles include silver coated glass particles, which can be used to make an elastomeric material electrically-conductive. In other embodiments, silver particles, silver coated copper particles, silver coated aluminum particles, silver plated nickel particles, nickel coated graphite particles, and graphite particles can also be used to make the elastomeric material electrically-conductive.

In alternative embodiments, the elastomer ribs 120 can be thermally conductive (e.g., have a great thermal conductivity than air alone, etc.) for creating a thermally-conducting heat path from the board level shield 102 to the printed circuit board. In such embodiments, the elastomer ribs 120 can be configured for contacting the board or one or more board-mounted electrical components when the apparatus 100 is installed. With this contact, the elastomer rib members 120 can facilitate transferring and/or thermally conducting of heat from the one or more electrical components to the board level shield 102.

The elastomer ribs 120 and board level shield 102 may cooperatively form or define at least one EMI shielding compartment or enclosure 122. In the illustrated embodiment, the apparatus 100 has an elastomer rib that encloses at least a substantial portion of the first cover portion 104 and the second cover portion 112, to thereby define the compartment 122.

With continued reference to FIG. 1, the EMI shielding apparatus 100 further includes a thermally-conductive material formed as a pad 130. The pad 130 may also be electrically-conductive.

The pad 130 is preferably configured to contact one or more electrical components when the apparatus 100 is installed. With this contact, the thermally-conductive pad 130 can facilitate transferring and/or thermally conducting heat from the one or more electrical components to the cover or board level shield 102. The pad 130 can form a thermally-conductive heat path between the one or more electrical components and the cover 102. With this thermally-conductive heat path, some embodiments have the board level shield or cover 102 operating as a heat sink and/or a heat spreader for the one or more electrical components.

In some embodiments, the thermally-conductive pad 130 may further comprise an adhesive backing (e.g., a thermally-conductive and/or electrically-conductive adhesive, etc.). The adhesive backing can be used to attach the pad 130 to the cover 102, which can help provide a more secure attachment of the pad 130 to the cover 102.

In this first embodiment, the one or more cover portions of the apparatus 100 are preferably made of a thermally-conductive and electrically-conductive material, such as steel or a thermally-conductive plastic, for example. Alternatively, other suitable materials can also be used for the cover 102 and the portions 104 and 112 thereof. Further examples of suitable materials are listed in the table below.

In various embodiments, the first and second cover portions 104 and 112 are integrally formed with each other, such as by a monolithic or single-piece steel material through a die-stamping or drawing process. Alternatively, the first and second cover portions 104 and 112 can be made with other materials (e.g., thermally-conductive plastic, etc.) and/or with other manufacturing methods (e.g., injection molding, etc.).

The apparatus 100 also comprises a third cover portion 134 adjacent to the second cover portion 112. The third cover portion 134 may also include an elastomer rib 120.

Figure 2:
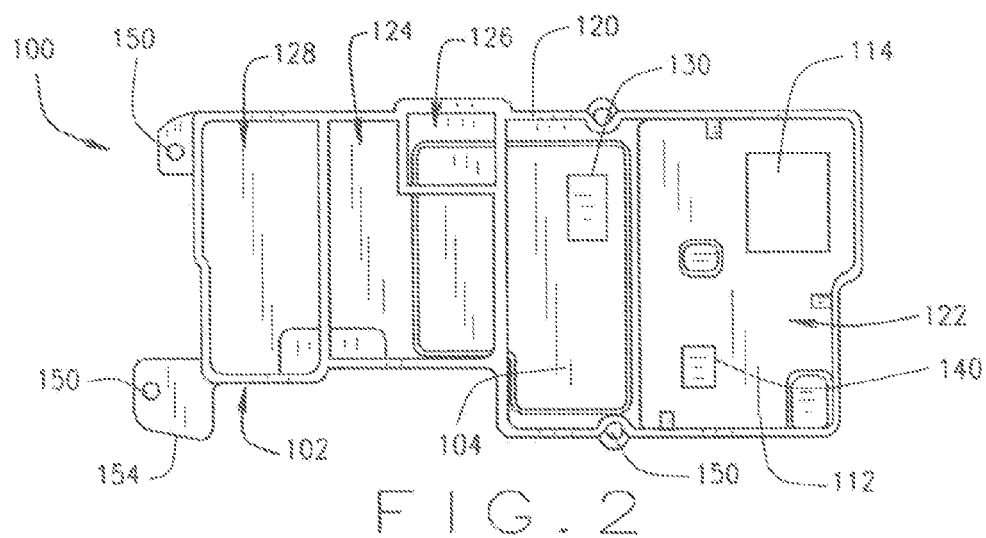
FIG. 2 is a plan view of the EMI shielding apparatus shown in FIG. 1.
Figure 3:
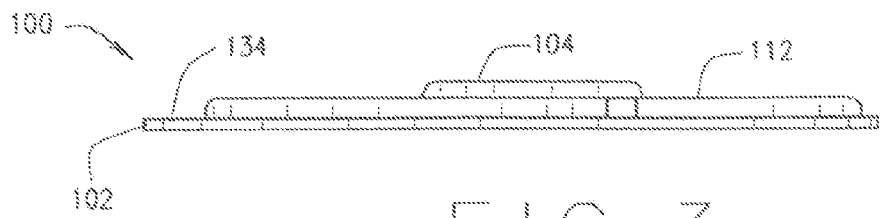
FIG. 3 is an elevation view of the EMI shielding apparatus shown in FIG. 1.

With further reference to FIG. 2, the rib 120 is shown forming compartments or enclosures 122, 124, 126, and 128. Accordingly, the cover 102 and the cover portions 104, 112, 134 are configured to form an EMI shielding apparatus 100 having a plurality of interior EMI shielding compartments 122, 124, 126, and 128. Accordingly, this particular embodiment of the EMI shielding apparatus 100 is provided with a single-piece board level shielding can or cover 102, multiple EMI shielding compartments 122, 124, 126, and 128, and thermally enhancing elements (e.g., pad 130, etc.) that provide for a heat conduction path between the apparatus 100 and one or more electrical components. This, in turn, can create a heat spreading effect for a board level circuit or other similar electronic devices.

The apparatus 100 may further comprise at least one insulating member 140, which in the first embodiment is disposed on the inner side of the second cover portion 112. The insulating member 140 can provide for insulating electrical components to prevent electrical conduction to the installed apparatus 100. Additionally, or alternatively, the insulating member 140 can provide for insulating electrical components from heat being conducted by the apparatus 100. Alternatively, one or more insulating members may be disposed at other locations and/or in other configurations (e.g., different shapes, sizes, etc.).

The insulating member 140 can be formed from various materials. By way of example only, silicone is one example of a preferred material that can be used for the insulating member 140 in some embodiments. Alternative examples of insulating materials include polyimide films, polyester films, and fiberglass.

As shown in FIG. 2, the apparatus 100 further includes one or more mounting holes 150 positioned generally about the perimeter of the shielding can or cover 102. The apparatus 100 may also include mounting tabs 154 extending from the perimeter of the cover 102, in which at least one of the mounting holes 150 may be positioned. Accordingly, screws can be received within the holes 150 for screwing the apparatus 100 into screw bosses of a housing of a wide range of electronic devices, such as cellular phones or other wireless/RF communication devices (e.g., laptop computers, Personal Digital Assistants (PDA), Geographic Positioning Service (GPS) receivers, etc.). When the apparatus 100 is installed, the screws can provide sufficient mechanical or clamping force for providing the apparatus 100 with low thermal impedance. For example, the clamping force can be sufficiently strong for biasing the board level shield generally towards the board such that the thermally-conductive pad compressively contacts the one or more electronic components. The screws can also be electrically conductive in some embodiments. Alternatively, other embodiments can use other means beside mechanical fasteners for installing an EMI shielding apparatus.

Some embodiments of the apparatus 100 can also include an electrically-conductive member that may be disposed on an interior surface of the shielding can or cover 102. In such embodiments, the electrically-conductive member can be configured to contact one or more electrical components when the apparatus 100 is installed such that electrical conductivity is established from one or more electrical components to the cover 102. The electrically-conductive member can be formed from various materials, such as relatively flexible graphite (with or without an adhesive backing) in some preferred embodiments. Alternative examples of materials that can be used for making electrical contact to establish electrical conductivity from the component to the cover (but which would not significantly or appreciably contribute to heat removal) include elastomeric materials filled with electrically-conductive particles. Exemplary elastomeric materials include silicone, fluorosilicone, fluorocarbon, Ethylene Propylene Diene Monomer [EPDM], and thermoplastic elastomers. Exemplary electrically-conductive particles include silver coated glass particles, silver particles, silver coated copper particles, silver coated aluminum particles, silver plated nickel particles, nickel coated graphite particles, and graphite particles.

Some embodiments of the apparatus 100 can also include an EMI absorbing material disposed on an interior surface of any one or more of the cover portions of the shielding can or cover 100. In such embodiments, the EMI absorbing material can be configured for improving the absorption of unwanted EMI radiation from electronic devices that are enclosed by the EMI shielding apparatus 100 after it is installed. Various materials can be used for EMI absorbing, such as elastomeric materials filled with high magnetic permeability particles in some preferred embodiments. By way of example only, polychloroprene [neoprene] is an example of one preferred material that can be used for the elastomeric material. Silicone, nitrile, fluorosilicone, and hypalon can also be used for the elastomeric material. Regarding the high magnetic permeability particles, one preferred example is carbonyl iron. Alternative example materials include iron silicide, ferrites, and carbon. Electrically-conductive carbon in polyurethane foam can also be used as an EMI absorbing material in some embodiments.

In various embodiments, the EMI shielding apparatus 100 includes at least one environmental sealing member disposed about a perimeter of at least one opening of the cover or shielding can. The environmental sealing member can substantially seal the opening's perimeter to thereby inhibit the ingress of dust and liquid. In the illustrated embodiment of FIG. 1, the apparatus 100 has elastomer ribs or wall portions 120 that generally surround at least a portion of the perimeter of the cover 102. The apparatus 100 may also include elastomer ribs or wall portions generally surrounding the perimeter of the opening 114 in the shield cover 102. The elastomer ribs or wall portion can provide environmental sealing for the apparatus 100 to inhibit the ingress of dust, liquid, and other foreign objects and debris. In addition, the elastomer ribs or wall portions providing environmental sealing can also be configured for providing electrical and/or thermal functionality for the apparatus 100.

Various materials can be used for accomplishing the environmental sealing, such as silicone, fluorosilicone, and thermoplastic elastomers. Alternative materials can also be used.

Figure 4:
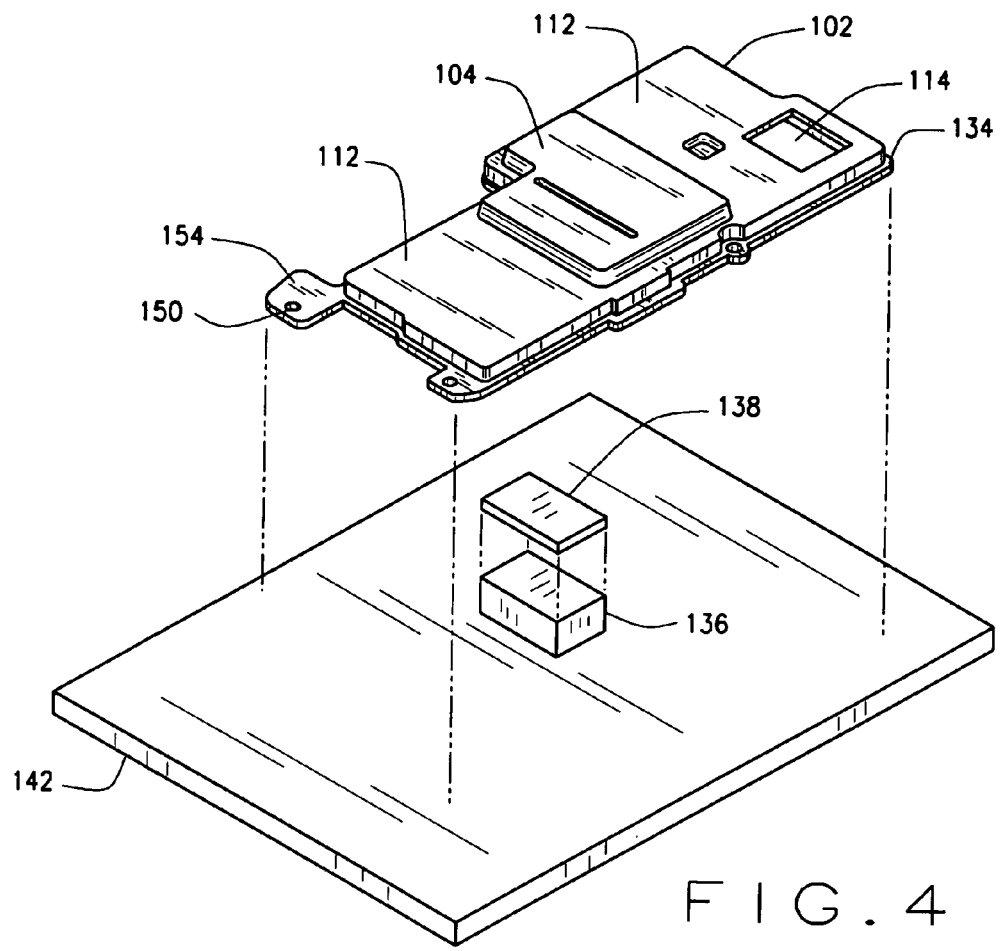
FIG. 4 is an exploded perspective view of the EMI shielding apparatus shown in FIG. 1 illustrating the EMI shielding apparatus aligned for positioning over a board-mounted electrical component according to exemplary embodiments.

Referring now to FIG. 4, the EMI shielding apparatus 100 is shown aligned for positioning over a board-mounted electrical component 136 with a thermal interface material 138 positioned between the electrical component 136 and the cover 102 according to some exemplary embodiments. Electrical component 136 can be any surface-mounted electrical component such as a resistor, a capacitor, a semiconductor device, an inductor, a transistor, an integrated circuit, a millimeter microwave integrated circuit (MMIC), a microcontroller, a microprocessor, a programmable gate array, logic circuits, an antenna element, etc. Embodiments disclosed and/or shown herein, however, are not limited to only surface-mounted electrical components.

Figure 5:
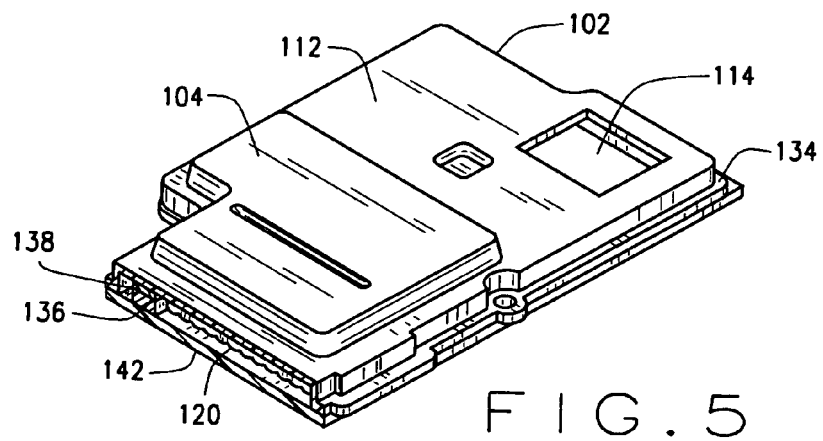
FIG. 5 is a partial perspective view of the EMI shielding apparatus shown in FIG. 4 with portions broken away and illustrating the EMI shielding apparatus disposed over the board-mounted electrical component.

The board level shielding can or cover 102 includes the resiliently compressible EMI gasket material 120, which in the illustrated embodiment of FIG. 5 comprises electrically-conductive elastomer ribs or walls. As shown in FIG. 5, the electrically-conductive elastomer ribs 120 are in contact with the PCB 142 (e.g., PCB ground plane, PCB ground conductor, etc.). The thermal interface material 138 can be pre-mounted on an inner surface of the cover 102, in some embodiments, to facilitate electronic device assembly. Screws positioned through holes 150 of mounting tabs 154 can be screwed to screw bosses to provide a clamping or mechanical force for compressing the thermal interface material 138 against the electrical component 136. This, in turn, can help provide the EMI shielding apparatus 10 with relatively low thermal impedance. The thermal interface material 138 can conductively transfer or remove heat from the electrical component 136 to the cover 102. Accordingly, in various embodiments, the thermal interface material 138 (and compression thereof against the electrical component 136) allow for improved heat transfer from the electrical component 136 to the cover 102, as compared to those designs in which air defines the heat path between the electrical component and the underside of the cover.

The thermal interface material 138 can be adhesively mounted to cover 102, as part of the device assembly. Accordingly, the thermal interface material 138 can thus provide a thermally conducting interface between component 136 and the inner surface of the cover 102. In some embodiments, a thermally-conductive elastomer rib 120 can contact a portion of an electrical component 136 to provide added thermal conductivity to the cover 102. The overall minimum height of the apparatus 100 can depend, for example, on the deflection needs for the electrically-conductive elastomer for the assembled device.

Figure 6:
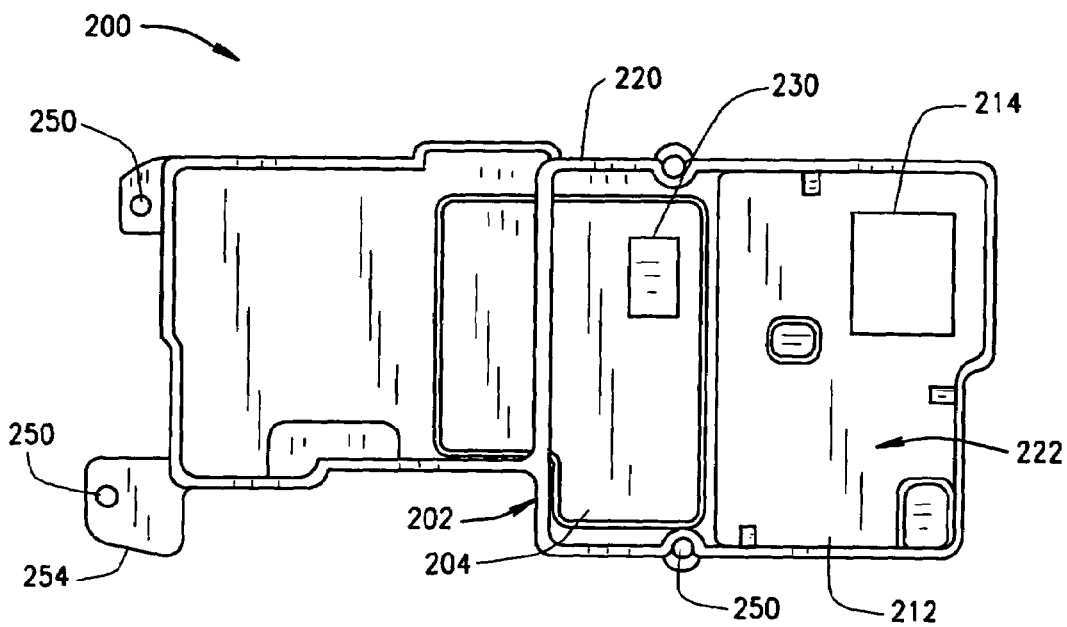
FIG. 6 is a plan view of a second exemplary embodiment of an EMI shielding apparatus.

Other alternative constructions or embodiments may be made similar to the first embodiment, where those alternate constructions or embodiments comprise any number of different configurations of thermally-conductive interface materials. For example, FIG. 6 illustrates a second exemplary embodiment of an EMI shielding apparatus 200 embodying one or more aspects of the present disclosure. As shown in FIG. 6, the EMI shielding apparatus 200 includes a first cover portion 204 and a second cover portion 212 adjacent to the first cover portion 204.

The apparatus 200 further includes elastomer ribs 220 disposed along at least a portion of the board level shield or cover 202. The elastomer ribs 220 and board level shielding can or cover 202 cooperatively form or define at least one EMI shielding compartment or enclosure 222.

The ribs 220 can be configured to contact one or more electrical components (such as a trace or pad on a printed circuit board, for example) when the apparatus 200 is installed. Accordingly, the rib 220 can help facilitate transferring and thermally conducting heat to the apparatus 200 from the one or more electrical components enclosed by the apparatus 200. The board level shield 202 and the ribs 220 can provide EMI shielding for one or more electrical components within the compartment 222, for example, by absorbing EMI from those electrical components.

With continued reference to FIG. 6, the EMI shielding apparatus 200 further includes a thermally-conductive material formed as a pad 230. The pad 230 may also be electrically-conductive.

The pad 230 is preferably configured to contact one or more electrical components when the apparatus 200 is installed. With this contact, the thermally-conductive pad 230 can facilitate transferring and/or thermally conducting heat from the one or more electrical components to the cover or board level shield 202. The pad 230 can form a thermally-conductive heat path between the one or more electrical components and the cover 202. With this thermally-conductive heat path, some embodiments have the board level shield or cover 202 operating as a heat sink for the one or more electrical components.

In some embodiments, the thermally-conductive pad 230 may further comprise an adhesive backing (e.g., a thermally-conductive and/or electrically-conductive adhesive, etc.). The adhesive backing can be used to attach the pad 230 to the cover 202, which can help provide a more secure attachment of the pad 230 to the cover 202.

As shown in FIG. 6, the apparatus 200 further includes one or more mounting holes 250 positioned generally about the perimeter of the cover 202. The apparatus 200 may also include mounting tabs 254 extending from the perimeter of the cover 202, in which at least one of the mounting holes 250 may be positioned. Accordingly, screws can be received within the holes 250 for screwing the apparatus 200 into screw bosses of a housing of a wide range of electronic devices, such as cellular phones or other wireless/RF communication devices. When the apparatus 200 is installed, the screws can provide sufficient mechanical or clamping force for providing the apparatus 200 with low thermal impedance. For example, the clamping force can be sufficiently strong for biasing the board level shield generally towards the board such that the thermally-conductive pad compressively contacts the one or more electronic components. The screws can also be electrically conductive in some embodiments. Alternatively, other embodiments can use other means beside mechanical fasteners for installing an EMI shielding apparatus.

The apparatus 200 also includes the opening 214, which can be provided to interface with various electronic device display screens and display technologies. Alternatively, the cover or board level shield 202 can have any number of different configurations, such as without any opening 114 and/or with different shapes, sizes, depths, openings in different shapes and/or sizes, etc.

Figure 7:
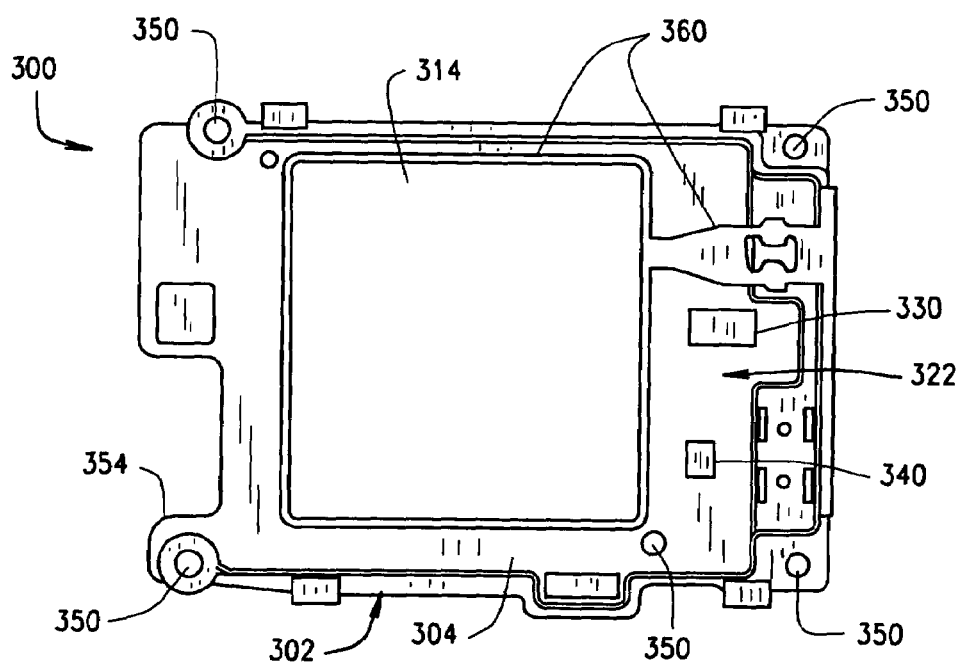
FIG. 7 is a plan view of a third exemplary embodiment of an EMI shielding apparatus.

FIG. 7 illustrates a third exemplary embodiment of an EMI shielding apparatus 300 embodying one or more aspects of the present disclosure. As shown, the apparatus 300 includes a board level shielding can or cover 302 having at least a first cover portion 304 and at least one opening 314 therein. Such EMI shield can be used to enclose one or more electrical components of a cellular phone, by way of example.

The cover 302 may be formed through a drawing process, a stamping process, or any other suitable manufacturing processes. The cover 302 can be made of a thermally-conductive and electrically-conductive material, such as steel or a thermally-conductive plastic, for example. The cover 302 can be made from a monolithic or single-piece steel material through a die-stamping or drawing process. Alternatively, the cover 302 can be made with other materials (e.g., thermally-conductive plastic, etc.) and/or with other manufacturing methods (e.g., injection molding, etc.). Further examples of suitable materials are listed in the table below.

The cover 302 may have differing heights or depths. In the illustrated embodiment of FIG. 7, the first cover portion 304 is drawn to form a deeper cover area in the generally center region than the perimeter regions. Alternatively, the cover 302 can have any number of different configurations, such as with different shapes, sizes, depths, openings in different shapes and/or sizes, etc.

With continued reference to FIG. 7, the apparatus 300 further includes a thermal interface material disposed therein. The thermal interface material can be formed as a thermally-conductive pad 330. The pad 330 can be configured to contact one or more electrical components (when the apparatus 300 is installed) to thermally conduct heat from one or more electrical components to the board level shielding can or cover 302. The thermally-conductive member 330 may be dispensed onto the shield cover 302 (e.g., using form-in-place dispensing equipment, hand-held dispenser or caulk gun, silk screening, etc.), or may be overmolded onto the cover 302 (e.g., through an insert-molding process, etc.).

In some embodiments, the thermally-conductive pad 330 may further comprise an adhesive backing (e.g., a thermally-conductive adhesive and/or electrically-conductive adhesive, etc.). The adhesive backing can be used to attach the pad 330 to the cover 302, which can help provide a more secure attachment of the pad 330 to the cover 302.

The apparatus 300 may further comprise at least one electrically-insulating member 340. In this particular embodiment, the electrically-insulating member 340 is disposed on an inner surface of the first cover portion 304. The electrically-insulating member 340 can be configured for insulating one or more electrical components to prevent electrical conduction to the cover 302 after installation. The apparatus 300 may alternatively include a thermally-insulating member disposed on an inner surface of the cover 302. The thermally-insulating member can provide for insulating electrical components from heat being conducted by the apparatus 300 or heat conducted by other electrical components. Alternatively, thermally-insulating members and/or electrically-insulating members may be disposed on any suitable position within the cover 302. Accordingly, this particular embodiment of the apparatus 300 generally includes a single-piece cover 302 having at least one EMI shielding compartment 322 and one or more thermally-enhancing features that provide for a heat conduction path between the apparatus 300 and one or more electrical components, and that can create a heat spreading effect for a board level circuit, for example.

As shown in FIG. 7, the apparatus 300 further includes one or more mounting holes 350 positioned generally about the perimeter of the cover 302. The apparatus 300 may also include mounting tabs 354 extending from the perimeter of the cover 302, in which at least one of the mounting holes 350 may be positioned. Accordingly, screws can be received within the holes 350 for screwing the apparatus 300 into screw bosses of a housing of a wide range of electronic devices, such as cellular phones or other wireless/RF communication devices. When the apparatus 300 is installed, the screws can provide sufficient mechanical or clamping force for providing the apparatus 300 with low thermal impedance. For example, the clamping force can be sufficiently strong for biasing the cover generally towards the board such that the thermally-conductive pad compressively contacts the one or more electronic components. The screws can also be electrically conductive in some embodiments. Alternatively, other embodiments can use other means beside mechanical fasteners for installing an EMI shielding apparatus.

Some embodiments of the apparatus 300 can also include an electrically-conductive member that may be disposed on an interior surface of the shielding can or cover 302. In such embodiments, the electrically-conductive member can be configured to contact one or more electrical components when the apparatus 300 is installed such that electrical conductivity is established from one or more electrical components to the cover 302.

Some embodiments of the apparatus 300 can also include an EMI absorbing material disposed on an interior surface of any one or more of the cover portions of the shielding can or cover 300. In such embodiments, the EMI absorbing material can be configured for improving the absorption of unwanted EMI radiation from electronic devices that are enclosed by the EMI shielding apparatus 300 after it is installed.

In various embodiments, the EMI shielding apparatus 300 includes one or more environmental sealing members disposed about a perimeter of at least one opening of the cover or shielding can. The environmental sealing member can substantially seal the opening's perimeter to thereby inhibit the ingress of dust and liquid.

In the illustrated embodiment of FIG. 7, the apparatus 300 has elastomer ribs or wall portions 360 generally surrounding the perimeter of opening 314. The elastomer ribs or wall portions 360 can be configured to provide environmental sealing to inhibit the ingress of dust, liquid, and other foreign objects and debris. In addition, the elastomer ribs or wall portions 360 can also be configured for providing electrical and/or thermal functionality for the apparatus 300.

The table below lists various exemplary metal alloys and their thermal conductivities, which may be used for a shielding can or cover in any one or more embodiments described and/or shown herein. This table is provided for purposes of illustration only and not for purposes of limitation.

| Alloy | Thermal Conductivity [W/m K] |
|---|---|
| SS 304 | 16 |
| NS C75200 | 33 |
| NS C77000 | 29 |
| C11000 | 388 |
| C17200 [CuBe] | 105 |
| C19400 | 260 |
| C19900 HPTC [CuTi] | 54 |

The table below lists various exemplary thermal interface materials that may be used as a thermal interface material for a shielding can or cover in any one or more embodiments described and/or shown herein. These example thermal interface materials are commercially available from Laird Technologies, Inc. of Saint Louis, Mo., and, accordingly, have been identified by reference to trademarks of Laird Technologies, Inc. This table is provided for purposes of illustration only and not for purposes of limitation.

| Name | Construction Composition | Type | Thermal Conductivity [W/mK] | Thermal Impedance [° C.-cm²/W] | Pressure of Thermal Impedance Measurement [kPa] |
|---|---|---|---|---|---|
| T-pli ™ 210 | Boron nitride filled, silicone elastomer, fiberglass reinforced | Gap Filler | 6 | 1.03 | 138 |
| T-flex ™ 520 | Reinforced silicone elastomer | Gap Filler | 2.8 | 2.56 | 69 |
| T-pcm ™ 583 | Non-reinforced film | Phase Change | 3.8 | 0.12 | 69 |
| T-flex ™ 320 | Ceramic filled silicone elastomer | Gap Filler | 1.2 | 5.42 | 69 |
| T-grease ™ | Silicone-based grease or non-silicone based grease | Thermal Grease | 1.2 | 0.135 | 345 |

In addition to the examples listed in the table above, other thermal interface materials can also be used, which are preferably better than air alone at conducting and transferring heat. Exemplary thermal interface materials include compliant or conformable silicone pads, silk screened materials, polyurethane foams or gels, thermal putties, thermal greases, thermally-conductive additives, etc. In some embodiments, one or more conformable thermal interface pads are used having sufficient compressibility and flexibility for allowing a pad to relatively closely conform to the size and outer shape of an electrical component when placed in contact with the electrical component when the shielding apparatus is installed (e.g. screwed to the printed circuit board, etc.) to a printed circuit board over the electrical component. By engaging the electrical component in this relatively close fitting and encapsulating manner, a conformable thermal interface pad can conduct heat away from the electrical component to the metal shield can or cover in dissipating thermal energy.

Advantageously, various embodiments can thus allow cost savings to customers and/or manufactures. Rather than having separate components to respectively provide shielding and thermal management, a customer/manufacturer can instead purchase an EMI shielding apparatus that can provide both board level EMI shielding and thermal management. In addition, various embodiments can provide for shielding and thermal management of relatively small electronic components and circuit board layouts, such as the electronic components and circuit board layouts associated with cellular telephones and other wireless/RF devices. As electronic components and layouts are decreasing in size (and increasing in component density), various embodiments are able to help meet the needs of increasing heat dissipation from such small electronic components and layouts.

Certain terminology is used herein for purposes of reference only, and thus is not intended to be limiting. For example, terms such as "upper", "lower", "above", "below", "front", "back", "rear", "bottom", and "side" can refer to directions in the drawings to which reference is made and/or can describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the methods "steps", "processes", and "operations" thereof described herein are not to be construed as necessarily requiring their performance in the particular order discussed or illustrated, unless specifically identified as an order or performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. An apparatus for providing board level EMI shielding and dissipating heat from one or more electrical components of a board, the apparatus comprising:
   a single-piece board level shield comprising a metal material and two or more portions of differing recessed depths; and
   at least one resiliently compressible EMI gasket disposed on the shield, the EMI gasket defining walls that are formed entirely by the EMI gasket and are of varying depth corresponding to the differing recessed depths, which walls extend below the single-piece board level shield and that define the periphery of a plurality of individual EMI shielding compartments cooperatively defined by the walls and the single-piece board level shield, wherein the plurality of individual EMI shielding compartments include a top surface defined by the single-piece board level shield, and sidewalls that define the periphery of each EMI shielding compartment formed to have corresponding differing recessed depths, whereby the EMI gasket and the single-piece board level shield cooperatively provide EMI shielding for each EMI shielding compartment to thereby inhibit the ingress and egress of EMI into and out of each EMI shielding compartment.

2. The apparatus of claim 1, further comprising at least one thermally-conductive compliant material disposed relative to an inner surface of the single-piece board level shield and to the one or more electrical components for forming a thermally-conducting heat path from the one or more electrical components to the single-piece board level shield.

3. The apparatus of claim 2, wherein the at least one thermally-conductive compliant material comprises at least one or more of a thermally-conductive pad, a thermally-conductive grease, and a thermally-conductive putty.

4. The apparatus of claim 1, wherein the at least one resiliently compressible EMI gasket comprises electrically-conductive elastomer.

* * * * *